United States Patent
Konrath et al.

(10) Patent No.: US 9,608,092 B2
(45) Date of Patent: Mar. 28, 2017

(54) METHOD OF MANUFACTURING A SEMICONDUCTOR DEVICE HAVING A RECTIFYING JUNCTION AT THE SIDE WALL OF A TRENCH

(71) Applicant: Infineon Technologies AG, Neubiberg (DE)

(72) Inventors: Jens Konrath, Villach (AT); Hans-Joachim Schulze, Taufkirchen (DE); Roland Rupp, Lauf (DE); Wolfgang Werner, Munich (DE); Frank Pfirsch, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/822,267

(22) Filed: Aug. 10, 2015

(65) Prior Publication Data

US 2015/0349097 A1 Dec. 3, 2015

Related U.S. Application Data

(62) Division of application No. 13/906,738, filed on May 31, 2013, now Pat. No. 9,136,397.

(51) Int. Cl.
| | | |
|---|---|---|
| *H01L 29/80* | (2006.01) | |
| *H01L 29/66* | (2006.01) | |
| *H01L 29/78* | (2006.01) | |
| *H01L 29/47* | (2006.01) | |
| *H01L 29/04* | (2006.01) | |
| *H01L 29/16* | (2006.01) | |
| *H01L 29/812* | (2006.01) | |
| *H01L 29/267* | (2006.01) | |
| *H01L 29/872* | (2006.01) | |

(52) U.S. Cl.
CPC ........ *H01L 29/66909* (2013.01); *H01L 29/04* (2013.01); *H01L 29/1608* (2013.01);
(Continued)

(58) Field of Classification Search
None
See application file for complete search history.

(56) References Cited

U.S. PATENT DOCUMENTS

| | | |
|---|---|---|
| 6,570,218 B1 | 5/2003 | Bol |
| 9,136,397 B2 | 9/2015 | Konrath et al. |

(Continued)

FOREIGN PATENT DOCUMENTS

| | | |
|---|---|---|
| DE | 102009047786 A1 | 1/2012 |
| KR | 20050085608 A | 8/2005 |

(Continued)

*Primary Examiner* — Minh-Loan Tran
(74) *Attorney, Agent, or Firm* — Murphy, Bilak & Homiller, PLLC (57) ABSTRACT

A method for forming a field-effect semiconductor device includes: providing a wafer having a main surface and a first semiconductor layer of a first conductivity type; forming at least two trenches from the main surface partly into the first semiconductor layer so that each of the at least two trenches includes, in a vertical cross-section substantially orthogonal to the main surface, a side wall and a bottom wall, and that a semiconductor mesa is formed between the side walls of the at least two trenches; forming at least two second semiconductor regions of a second conductivity type in the first semiconductor layer so that the bottom wall of each of the at least two trenches adjoins one of the at least two second semiconductor regions; and forming a rectifying junction at the side wall of at least one of the at least two trenches.

16 Claims, 8 Drawing Sheets

(52) U.S. Cl.
CPC ............ *H01L 29/267* (2013.01); *H01L 29/47* (2013.01); *H01L 29/66068* (2013.01); *H01L 29/66431* (2013.01); *H01L 29/66734* (2013.01); *H01L 29/66787* (2013.01); *H01L 29/66848* (2013.01); *H01L 29/7827* (2013.01); *H01L 29/8122* (2013.01); *H01L 29/872* (2013.01)

(56) References Cited

U.S. PATENT DOCUMENTS

| | | | |
|---|---|---|---|
| 2005/0067630 A1* | 3/2005 | Zhao | H01L 29/8083 257/134 |
| 2009/0278137 A1 | 11/2009 | Sheridan et al. | |
| 2011/0133212 A1* | 6/2011 | Sheridan | H01L 29/66068 257/77 |
| 2012/0161208 A1 | 6/2012 | Veliadis | |
| 2012/0313108 A1 | 12/2012 | Tsuchiya et al. | |
| 2015/0115353 A1 | 4/2015 | Zundel et al. | |
| 2015/0115356 A1 | 4/2015 | Brandl et al. | |
| 2016/0035845 A1 | 2/2016 | Brandl et al. | |

FOREIGN PATENT DOCUMENTS

| | | |
|---|---|---|
| KR | 20100115768 A | 10/2010 |
| WO | 2010006107 A2 | 1/2010 |
| WO | 2011071973 A2 | 6/2011 |

* cited by examiner

METHOD OF MANUFACTURING A SEMICONDUCTOR DEVICE HAVING A RECTIFYING JUNCTION AT THE SIDE WALL OF A TRENCH

TECHNICAL FIELD

Embodiments of the present invention relate to semiconductor devices, in particular to power semiconductor transistors having a vertical channel, and to related methods for producing heterojunction semiconductor devices.

BACKGROUND

Semiconductor transistors, in particular field-effect controlled switching devices such as a MISFET (Metal Insulator Semiconductor Field-effect Transistor), in the following also referred to as MOSFET (Metal Oxide Semiconductor Field-effect Transistor), a JFET (Junction Gate Field-effect Transistor) and a MESFET (Metal Semiconductor Field-effect Transistor) have been used for various applications including but not limited to use as switches in power supplies and power converters, as a voltage-controlled resistance, in consumer electronics, for example stereo systems, and communication technology, for example for microwave frequency communications and radar.

Particularly with regard to power devices capable of switching large currents and/or operating at higher voltages, low on-state resistance Ron, low leakage current, low switching losses and/or low parasitic device capacitances such as the Miller capacitance, which is related to the gate-drain capacitance between the gate electrode and the drain region of the field-effect transistor and the gate-source capacitance between the gate electrode and the source region of the field-effect transistor, are often required Further, there are on-going developments to increase the yield of the manufacturing of semiconductor transistors.

For these and other reasons there is a need for the present invention.

SUMMARY

According to an embodiment of a field-effect semiconductor device, the field-effect semiconductor device includes a semiconductor body having a main surface. The semiconductor body includes, in a vertical cross-section substantially orthogonal to the main surface, a drift layer of a first conductivity type, a semiconductor mesa of the first conductivity type adjoining the drift layer, substantially extending to the main surface and having two side walls, and two second semiconductor regions of a second conductivity type arranged next to the semiconductor mesa. Each of the two second semiconductor regions forms a pn-junction at least with the drift layer. A rectifying junction is formed at least at one of the two side walls of the mesa.

According to an embodiment of a field-effect semiconductor device, the field-effect semiconductor device includes a semiconductor body having a main surface. In a vertical cross-section substantially orthogonal to the main surface, the semiconductor body includes: a first semiconductor region of a first conductivity type and having a first semiconductor material, at least two trenches extending from the main surface partly into the first semiconductor region, each of the at least two trenches having at least one side wall and a bottom wall. Either a Schottky-layer forming a Schottky contact with the first semiconductor region is arranged on a lower portion of the at least one side wall of each of the at least two trenches and, or a semiconductor layer of a second semiconductor material forming a hetero-junction with the first semiconductor region is arranged on the lower portion of the at least one side wall of each of the at least two trenches and. In the vertical cross-section, the semiconductor body further includes: an embedded current spread layer of the first conductivity type; and/or at least two second semiconductor regions of a second conductivity type. Each of the at least two second semiconductor regions forms a pn-junction with the first semiconductor region and adjoins the bottom wall of one of the at least two trenches. The embedded current spread layer is arranged below the at least two trenches, in ohmic contact with the first semiconductor region, and has a maximum doping concentration higher than a maximum doping concentration of the first semiconductor region.

According to an embodiment of a method for producing a field-effect semiconductor device, the method includes: providing a wafer having a main surface and a first semiconductor layer of a first conductivity type; forming at least two trenches from the main surface partly into the first semiconductor layer so that each of the at least two trenches includes, in a vertical cross-section substantially orthogonal to the main surface, a side wall and a bottom wall, and that a semiconductor mesa is formed between the side walls; forming at least two second semiconductor regions of a second conductivity type in the first semiconductor layer so that the bottom wall of each of the at least two trenches adjoins one of the at least two second semiconductor regions; and forming a rectifying junction at the side wall of at least one of the at least two trenches.

According to an embodiment of a method for producing a field-effect semiconductor device, the method includes: providing a wafer having a main surface, a first semiconductor layer of a first conductivity type extending to the main surface, and an embedded current spread layer of the first conductivity type having a maximum doping concentration higher than a maximum doping concentration of the first semiconductor layer; forming at least two trenches from the main surface partly into the first semiconductor layer so that each of the at least two trenches includes, in a vertical cross-section substantially orthogonal to the main surface, a side wall and a bottom wall arranged above the current spread layer, and that a semiconductor mesa is formed between the side walls of the at least two trenches; and forming a rectifying junction at the side wall of each of the at least two trenches.

Those skilled in the art will recognize additional features and advantages upon reading the following detailed description, and upon viewing the accompanying drawings.

BRIEF DESCRIPTION OF THE DRAWINGS

The components in the figures are not necessarily to scale, instead emphasis being placed upon illustrating the principles of the invention. Moreover, in the figures, like reference numerals designate corresponding parts. In the drawings.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appending claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a first or main surface of a semiconductor substrate or body. This can be for instance the surface of a wafer or a die.

The term "vertical" as used in this specification intends to describe an orientation which is substantially arranged perpendicular to the first surface, i.e. parallel to the normal direction of the first surface of the semiconductor substrate or body.

In this specification, a second surface of a semiconductor substrate of semiconductor body is considered to be formed by the lower or backside surface while the first surface is considered to be formed by the upper, front or main surface of the semiconductor substrate. The terms "above" and "below" as used in this specification therefore describe a relative location of a structural feature to another structural feature with consideration of this orientation.

In this specification, n-doped is referred to as first conductivity type while p-doped is referred to as second conductivity type. Alternatively, the semiconductor devices can be formed with opposite doping relations so that the first conductivity type can be p-doped and the second conductivity type can be n-doped. Furthermore, some FIGS. illustrate relative doping concentrations by indicating "−" or "+" next to the doping type. For example, "n$^-$" means a doping concentration which is less than the doping concentration of an "n"-doping region while an "n$^+$"-doping region has a larger doping concentration than the "n"-doping region. However, indicating the relative doping concentration does not mean that doping regions of the same relative doping concentration have to have the same absolute doping concentration unless otherwise stated. For example, two different n$^+$-doping regions can have different absolute doping concentrations. The same applies, for example, to an n$^+$-doping and a p$^+$-doping region.

Specific embodiments described in this specification pertain to, without being limited thereto, to field-effect semiconductor devices such as MESFETs and JFETs, in particular to vertical power field-effect transistors, and to manufacturing methods therefor.

The term "heterojunction" as used in this specification intends to describe an interface between two layers or regions of a semiconductor material with different crystal structure. These semiconducting materials have typically different band gaps.

Typically, the semiconductor device is a power semiconductor device having an active area with a plurality of transistor-cells for carrying and/or controlling a load current between two load metallization. Furthermore, the power semiconductor device may have a peripheral area with at least one edge-termination structure at least partially surrounding an active area of transistor-cells when seen from above.

The term "power semiconductor device" as used in this specification intends to describe a semiconductor device on a single chip with high voltage and/or high current switching capabilities. In other words, power semiconductor devices are intended for high current, typically in the Ampere range and/or high voltages, typically above 100 V, more typically above 400 V.

The term "field-effect" as used in this specification intends to describe the electric-field mediated formation of a conductive "channel" of a first conductivity type and/or control of conductivity and/or shape of the channel between two regions of the first conductivity type. The conductive channel may be formed and/or controlled in a semiconductor region of a second conductivity type, typically a body region of the second conductivity type, which is arranged between the two regions of the first conductivity type. Due to the field-effect, a unipolar current path through the channel region is formed and/or controlled between a source region or emitter region of the first conductivity type and a drift region of the first conductivity type in a MOSFET-structure and an IGBT-structure, respectively. The drift region may be in contact with a higher doped drain region of the first conductivity type or a higher doped collector region of the second conductivity type, respectively. The drain region or the collector region is in low resistive electric contact with a drain or collector electrode. The source region or emitter region is in low resistive electric contact with a source or emitter electrode. In a JFET-structure and a MESFET-structure, respectively, the channel region is typically formed by a portion of the drift region forming one or two rectifying junction(s) with one or two gate region(s), and may be controlled by changing the width of the depletion layer(s) formed between the gate region(s) and the channel region.

In the context of the present specification, the terms "in ohmic contact", in resistive electric contact" and "in resistive electric connection" intend to describe that there is an ohmic current path between respective elements or portions of a semiconductor device at least when no voltages or only low probe voltages are applied to and/or across the semiconductor device. Likewise, the terms in low ohmic contact, "in low resistive electric contact" and "in low resistive electric connection" intend to describe that there is a low resistive ohmic current path between respective elements or portions of a semiconductor device at least when no voltages are applied to and/or across the semiconductor device. Within this specification the terms "in low ohmic contact", "in low resistive electric contact", "electrically coupled", and "in low resistive electric connection" are used synonymously. In some embodiments, the resistivity of a low resistive current path between respective elements or portions of a semiconductor device which is low when low voltages are applied to and/or across the semiconductor device, for example a probe voltage of less than one or a few volts, becomes high above a threshold voltage, for example due to depleting a semiconductor region forming at least a part of the current path.

In the context of the present specification, the term "metallization" intends to describe a region or a layer with metallic or near metallic properties with respect to electric conductivity. A metallization may be in contact with a semiconductor region to form an electrode, a pad and/or a terminal of the semiconductor device. The metallization may be made of and/or comprise a metal such as Al, Ti, W, Cu, Mo and Co, or a metal alloy such as NiAl, but may also be made of a material with metallic or near metallic properties with respect to electric conductivity such as highly doped n-type or p-type poly-Si, TiN, an electrically conductive silicide such as $TaSi_2$, $TiSi_2$, PtSi, $CoSi_2$, $WSi_2$, $MoSi_2$ or an electrically conductive carbide such as AlC, NiC, MoC, TiC, CoC, PtC, WC or the like. The metallization may also include different electrically conductive materials, for example a stack of those materials.

In the following, embodiments pertaining to semiconductor devices and manufacturing methods for forming semiconductor devices are explained mainly with reference to silicon carbide (SiC) semiconductor devices having a monocrystalline SiC semiconductor body. Accordingly, a semiconductor region or layer is typically a monocrystalline SiC-region or SiC-layer if not stated otherwise.

It should, however, be understood that the semiconductor body can be made of any semiconductor material suitable for manufacturing a semiconductor device. Examples of such materials include, without being limited thereto, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaP), aluminum gallium nitride (AlGaN), aluminum indium nitride (AlInN), indium gallium nitride (InGaN), aluminum gallium indium nitride (AlGaInN) or indium gallium arsenide phosphide (InGaAsP), and binary or ternary II-VI semiconductor materials such as cadmium telluride (CdTe) and mercury cadmium telluride (HgCdTe) to name few. The above mentioned semiconductor materials are also referred to as homojunction semiconductor materials. When combining two different semiconductor materials a heterojunction semiconductor material is formed. Examples of heterojunction semiconductor materials include, without being limited thereto, aluminum gallium nitride (AlGaN)-aluminum gallium indium nitride (AlGaInN), indium gallium nitride (InGaN)-aluminum gallium indium nitride (AlGaInN), indium gallium nitride (InGaN)-gallium nitride (GaN), aluminum gallium nitride (AlGaN)-gallium nitride (GaN), indium gallium nitride (InGaN)-aluminum gallium nitride (AlGaN), silicon-silicon carbide ($Si_xC_{1-x}$) and silicon-SiGe heterojunction semiconductor materials. For power semiconductor applications currently mainly Si, SiC, GaAs and GaN materials are used. If the semiconductor body comprises a high band gap material such as SiC or GaN which has a high breakdown field strength and high critical avalanche field strength, respectively, the doping of the respective semiconductor regions can be chosen higher which reduces the on-state resistance $R_{on}$.

Figure 1:
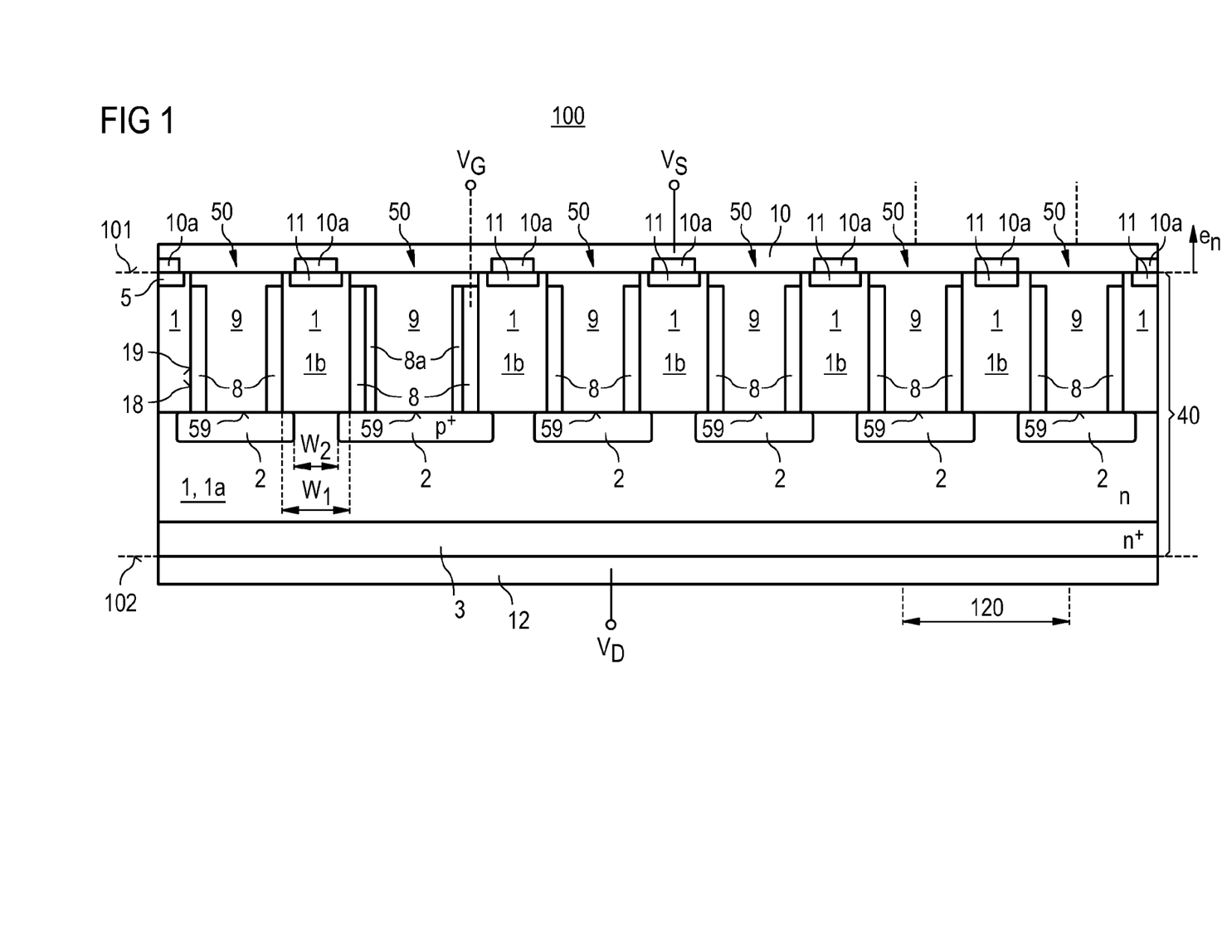
FIG. 1 illustrates a cross-section through a semiconductor body of a field-effect semiconductor device according to an embodiment.

With reference to FIG. 1, embodiments of a field-effect semiconductor device 100 are explained. FIG. 1 illustrates a schematic cross-section through a semiconductor body 40 of the semiconductor device 100. The semiconductor body 40 includes a main surface 101 defining a vertical direction $e_n$, and a back surface 102 opposite the main surface 101.

In the exemplary embodiment, an n-type drift layer 1a having a first maximum doping concentration is embedded in the semiconductor body 40 and in ohmic contact with a drain metallization 12 arranged on the back surface 102 via an n-type drain layer 3 which extends to the back surface 102. The drain layer 3 has a maximum doping concentration which is higher than the first maximum doping concentration.

According to an embodiment, a plurality of spaced apart n-type semiconductor mesas 1b are arranged on the drift layer 1. Each of the semiconductor mesas 1b adjoins the drift layer 1, and substantially extends to the main surface 101.

In the context of the present specification, the term "semiconductor mesa" intends to describe semiconductor regions which extend from a common substrate or a common semiconductor layer to a main surface of the semiconductor body or wafer and are spaced apart from each other. Typically, a semiconductor mesa is, in a vertical cross-section which is substantially orthogonal to the main surface, arranged between two adjacent trenches extending from the main surface into the semiconductor body or wafer. The trenches may be substantially vertical (vertical trenches), i.e. the side walls of the trenches and the semiconductor mesa, respectively, may, in the vertical cross-section, be substantially orthogonal to the main surface. In the vertical cross-section, the two side walls of a trench and a semiconductor mesa, respectively, may also be tapered. The terms "semiconductor mesa" and "mesa" are used synonymously within this specification. In the following the two side walls of a trench and a semiconductor mesa, respectively, are also referred to as first side wall and second side wall.

In the vertical cross-section shown in FIG. 1, the mesas 1b are arranged between respective adjacent pairs of vertical trenches 50 which extend from the main surface 102 substantially to the drift layer 1a. The trenches 50 may have a vertical extension of about 1 μm to about 2 μm, or even to about 10 μm or a few 10 μm. Each of the mesas 1b is in ohmic contact with a source contact 10a, typically via a respective n-type source contact region 11 formed in the mesas 1b and having a higher maximum doping concentration than the mesas 1b. Each source contact 10a is arranged on the main surface 101 and one of the semiconductor mesas 1b, respectively. The source contacts 10a may, for example, be made of a nickel aluminum alloy. Typically, the aluminum content of the nickel aluminum alloy is in a range from about 2% to about 16% for a SiC semiconductor device 100.

Typically, a front side metallization 10 forming a source terminal is arranged on the main surface 101 for contacting the source contacts 10a and mesas 1b, respectively.

In the exemplary embodiment illustrated in FIG. 1, a rectifying junction 18 is formed at each of the side walls 19 of the semiconductor mesas 1b. For sake of clarity, only one of the plurality of side walls 19 and rectifying junctions 18 is denoted with the respective reference numeral 18, 19. Each rectifying junction 18 is formed between one of the semiconductor mesas 1b and a gate region forming layer 8 which is arranged on a side wall of the semiconductor mesa 1b, and in ohmic contact with a common gate metallization (not shown in FIG. 1). The gate region forming layer 8 is in the following also referred to as gate layer. A common gate metallization is also typically arranged on the main surface 101. Accordingly, the semiconductor device 100 is a three-terminal normally-on field-effect semiconductor device. For controlling a substantially vertical current between the common source metallization 10 at source potential $V_S$ and the drain metallization 12 at drain potential $V_D$ and through an n-type first semiconductor region 1 formed by the mesas 1b and the drift layer 1a, and through the adjoining drain layer 3, a suitable gate potential $V_G$ may be applied. For switching off the semiconductor device 100, the gate potential or gate voltage $V_G$ and the source potential or source voltage $V_S$ may be chosen such that the rectifying junctions 18 are reverse biased and a current blocking depletion region (space charge region) is formed in each of the mesas 1b. The maximum doping concentration of the channel region forming portions of the mesas 1b may, depending on aimed device characteristics, have substantially the same or a different maximum doping concentration as the drift layer 1a.

In the exemplary embodiment illustrated in FIG. 1, the semiconductor device 100 is formed as a normally-on n-channel field-effect semiconductor device having a plurality of n-channel regions which are substantially formed in or by the mesas 1b. To switch off the n-channel device 100 typically requires a negative gate-source voltage $V_{GS}=V_G-V_S<0$.

In other embodiments, the doping relations shown in FIG. 1 are reversed to form a normally-on p-channel field-effect semiconductor device which may be switched off by an appropriate positive gate-source voltage $V_{GS}$.

According to an embodiment, the rectifying junctions 18 are Schottky-junctions. In this embodiment, the gate layers 8 are Schottky-layers, i.e. Schottky-contact forming metal layers, for example titanium layers. Accordingly, the semiconductor device 100 is a MESFET, typically a power MESFET having a plurality of unit cells 120. For sake of clarity, only one of the unit cells is denoted with the reference numeral 120.

As illustrated in the second vertical trench 50 from the left, a conductive layer 8a having a higher electric conductivity than the Schottky-layer 8 may be arranged on the Schottky-layer 8 to improve the electric contact with the common gate metallization. The conductive layer 8a may be a metal layer or a highly doped poly-silicon layer (poly-Si).

A dielectric region 9 is arranged in each of the trenches 50 and between the front side metallization 10 and the Schottky-layer 8 and the conductive layer 8a, respectively. The dielectric regions 9 are at least arranged in respective upper portions of the trenches 50 but may also extend from the main surface 101 to respective bottom walls 59 as illustrated in FIG. 1. Further, the dielectric regions 9 may extend, in the vertical cross-section and next to the main surface 101, between neighboring ones of the semiconductor mesas 1b. Typically, the trenches 50 are void-free. In other embodiments, one or more voids are provided in each of the trenches 50. Accordingly, the mechanical stress may be reduced.

According to an embodiment, the bottom wall 59 of each vertical trench 50 adjoins a respective p-type second semiconductor region 2. The maximum doping concentration of the second semiconductor regions 2 is typically higher than about $10^{17}$ cm$^{-3}$, more typically higher than about $10^{18}$ cm$^{-3}$. Each of the second semiconductor regions 2 forms a pn-junction with the drift layers 1a and 1b. The spaced apart second semiconductor regions 2 and the pn-junctions formed with the drift layers 1a and 1b, respectively, may be substantially centered with respect to the trenches 50. Further, each semiconductor mesa 1b may, in the vertical cross-section, be substantially centered with respect to the adjacent second semiconductor regions 2.

During a blocking mode of the semiconductor device 100, in which the rectifying junctions 18 are reverse biased, space charge regions (depletion regions) are formed which extend from respective ones of the second semiconductor regions 2 into the drift layer 1a and may even merge with each other and typically also with depletion regions formed in the mesas 1b. Furthermore, high electric fields are avoided close to the Schottky-layer 8 next to the bottom walls of the trenches 50 during the blocking mode by the implementation of the second semiconductor regions 2. Accordingly, the leakage current may be reduced without substantially altering the unipolar behavior of the semiconductor device 100 compared to semiconductor devices without the second semiconductor regions 2. For this purpose, the second semiconductor regions 2 are typically in Ohmic contact with the gate metallization, for example via respective Schottky-layers 8 and/or respective conductive layers 8a.

Typically, the horizontal extension of the second semiconductor regions 2 is, in the vertical cross-section, larger than a horizontal extension of the trenches 50. Accordingly, each of the second semiconductor regions 2 adjoins neighboring semiconductor mesas 1b and a narrowing of the controllable n-type current path is formed below each mesa 1b. This facilitates reducing the leakage current during the blocking mode. For example, a distance $w_2$ between two adjacent second semiconductor regions 2 may, in the vertical cross-section, be less than about 90%, more typically about 80% of a horizontal extension $w_1$ of the mesas 1b.

The horizontal extension $w_1$ and the maximum doping concentration of the mesas 1b may be chosen to adjust their resistance and the Miller-capacitance of the semiconductor device 100. The gate-drain leakage current may also depend on the horizontal extension $w_1$ and the maximum doping concentration of the mesas 1b, but is mainly adjustable by the ratio between the horizontal extension $w_1$ of the mesas 1b and the distance $w_2$ between two adjacent second semiconductor regions 2. The rated blocking voltage of the semiconductor device 100 is mainly determined by the doping concentration of the drift layer 1a. Thus, the semiconductor device 100 may be optimized with regard to its operational conditions by appropriately choosing the doping concentration of the drift layer 1a, the horizontal extension $w_1$, the maximum doping concentration of the mesas 1b and the distance $w_2$ between two adjacent second semiconductor regions 2.

Figure 2:
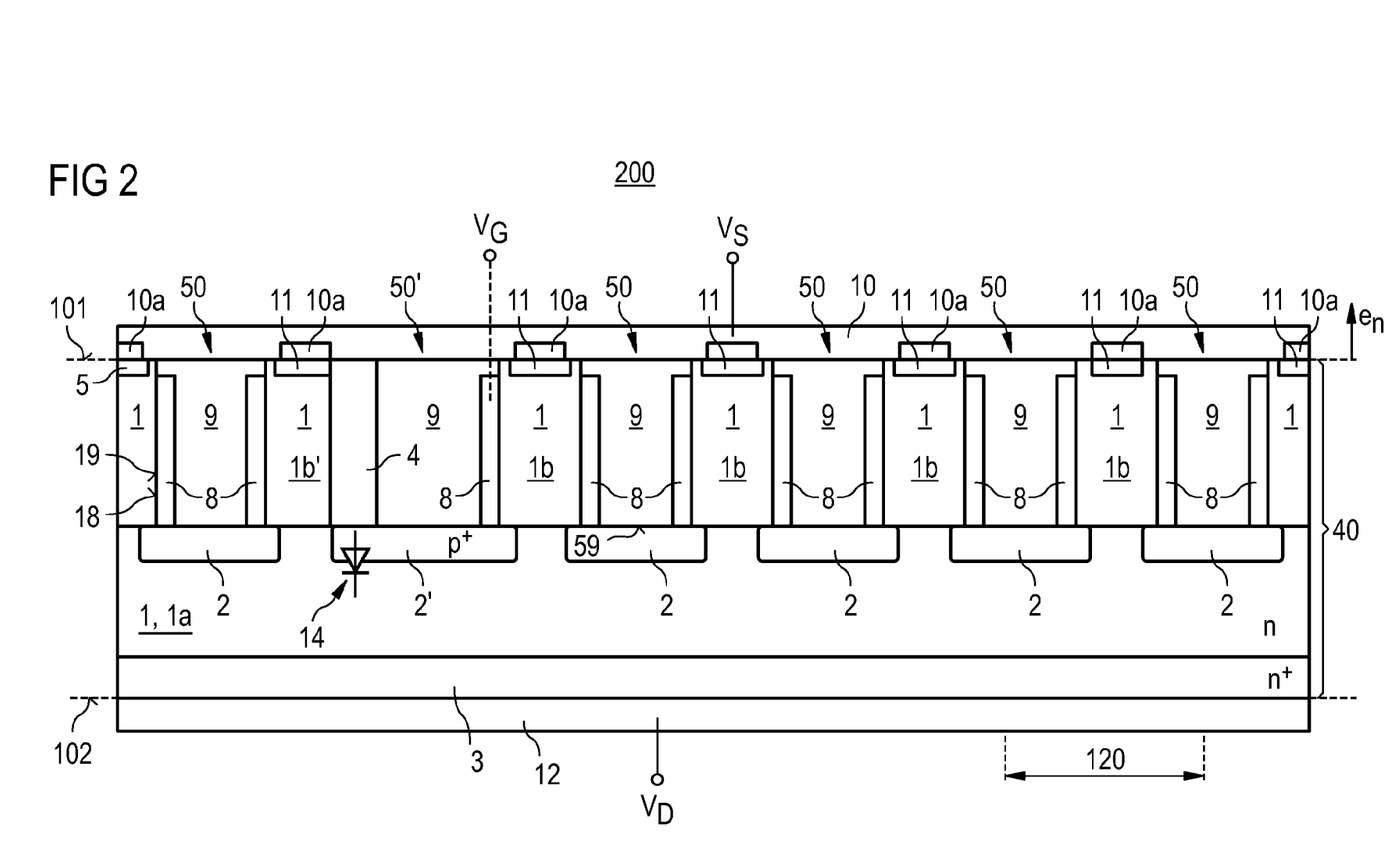
FIG. 2 illustrates a cross-section through a semiconductor body of a field-effect semiconductor device according to an embodiment.

FIG. 2 illustrates a vertical cross-section through a semiconductor device 200. The semiconductor device 200 is similar to the semiconductor device 100 illustrated above with regard to FIG. 1 and may also be operated as a MESFET. However, the semiconductor device 200 further includes at least one trench 50' with a highly doped p-type or metallic contact region 4 which extends between the front side metallization 10 and the adjoining second semiconductor regions 2' to provide an ohmic contact between the second semiconductor regions 2' and the front side metallization 10. Accordingly, the semiconductor device 200 includes an integrated body diode 14 formed between the second semiconductor regions 2' and the drift layer 1a. Accordingly, device operation during an avalanche mode may be improved by providing a stable (non-destructive) current path for the avalanche mode.

Figure 3:
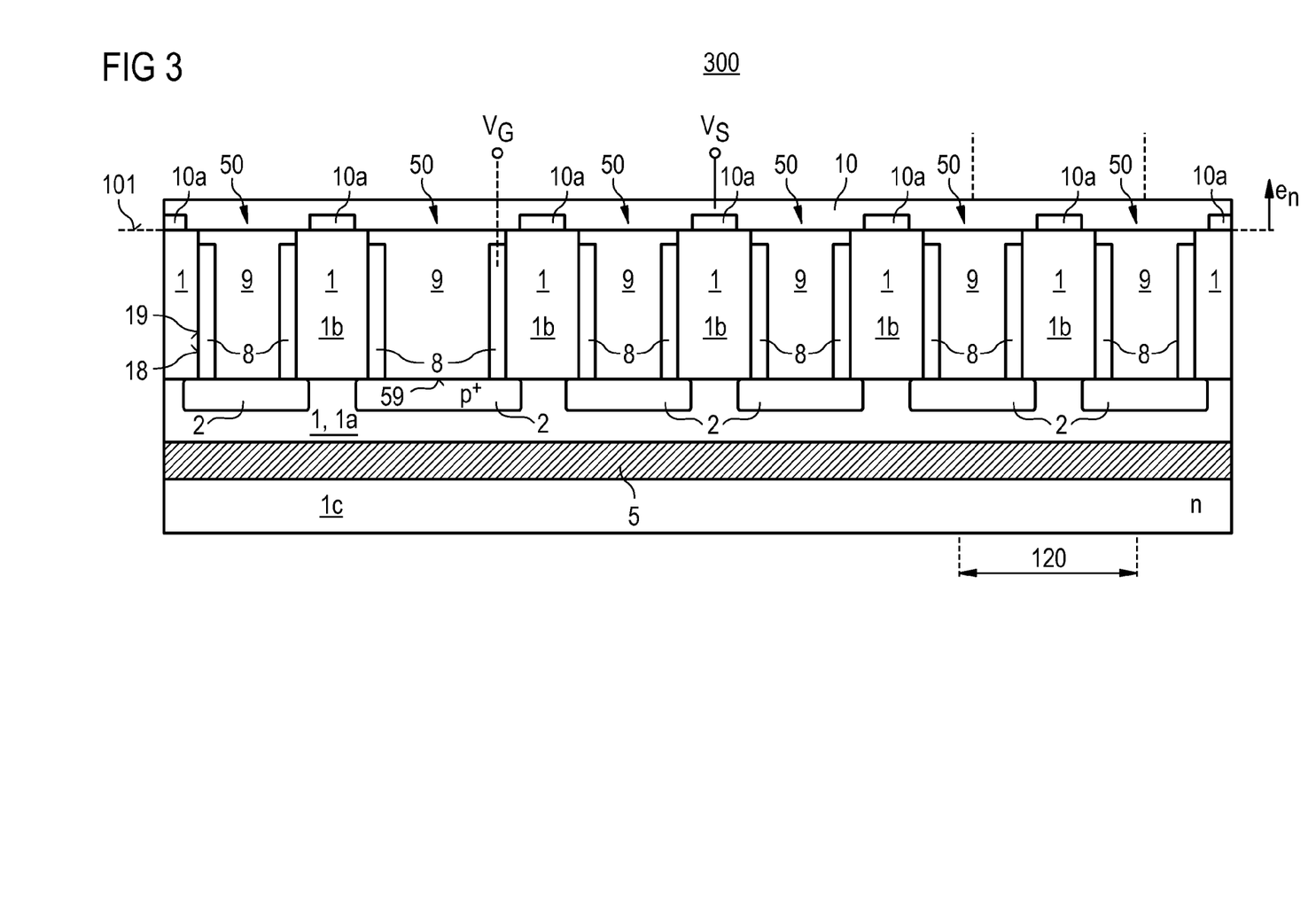
FIG. 3 illustrates a cross-section through a semiconductor body of a field-effect semiconductor device according to an embodiment.

FIG. 3 illustrates a vertical cross-section through a semiconductor device 300. The semiconductor device 300 is similar to the semiconductor device 100 illustrated above with regard to FIG. 1 and may also be operated as a MESFET. For sake of clarity, the drain layer (3) and the drain electrode (12) are not shown in FIG. 3. However, the semiconductor device 300 further includes an n-type current spread layer 5 which is embedded in the drift layer 1a, 1c and has a higher maximum doping concentration than the drift layer 1a, 1c. Accordingly, the on-resistance of the semiconductor device 300 may be reduced. In the illustrated vertical cross-section, the current spread layer 5 divides the drift layer 1a, 1c in an upper portion 1a and a lower portion 1c.

The current spread layer 5 may also be structured when seen from above.

Figure 4:
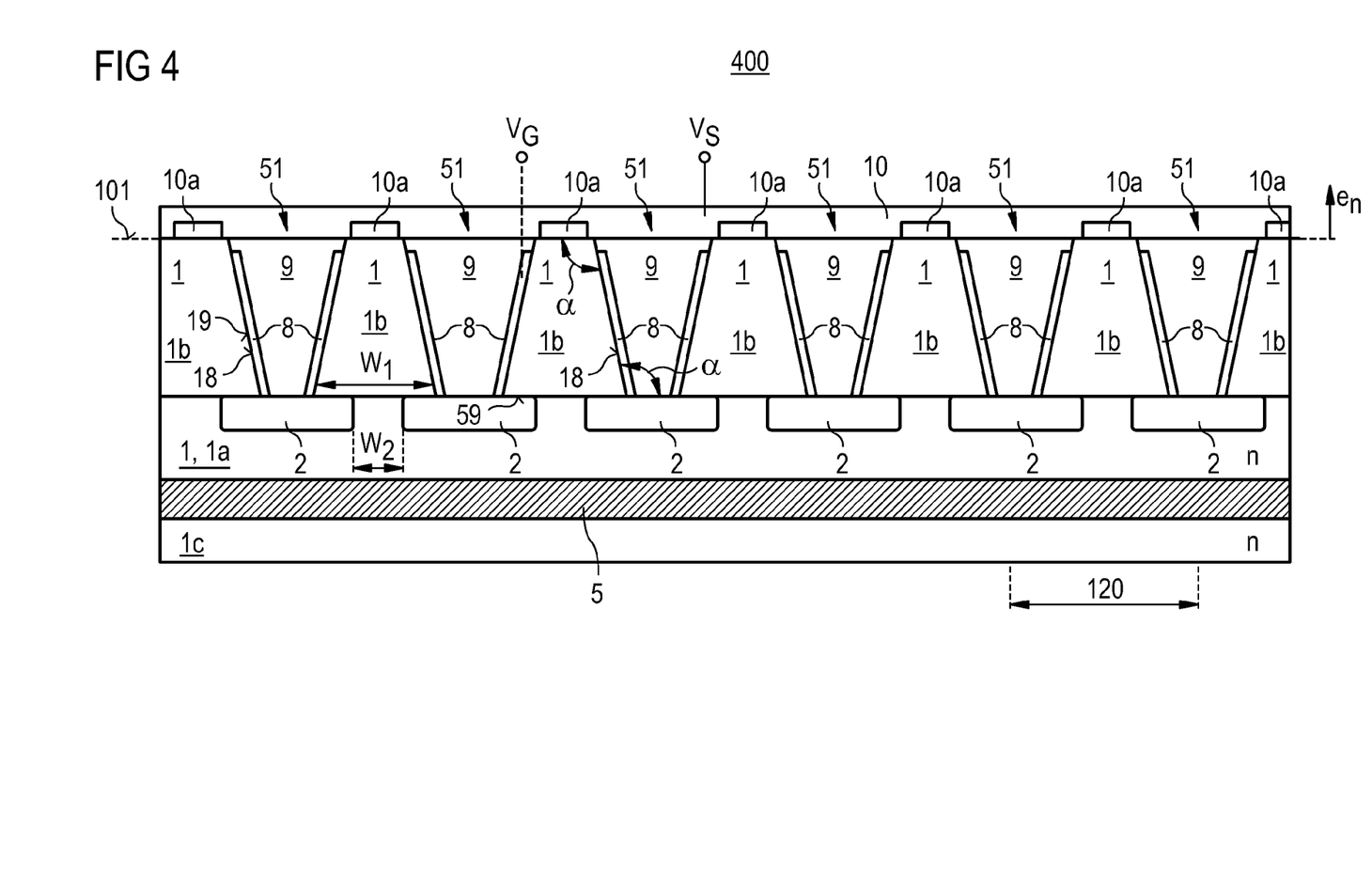
FIG. 4 illustrates a cross-section through a semiconductor body of a field-effect semiconductor device according to an embodiment.

FIG. 4 illustrates a vertical cross-section through a semiconductor device 400. The semiconductor device 400 is similar to the semiconductor device 300 illustrated above with regard to FIG. 3 and may also be operated as a MESFET. However, the side walls 19 of the mesas 1b and vertical trenches 51 of the semiconductor device 400 are tapered. Accordingly, manufacturing of the semiconductor device 400 is typically facilitated. Typically an angle α between the side walls 19 and the main surface 101 and the respective trench bottom 59, respectively, is larger than about 92° and less than about 105°.

Typically, the (mathematically) integrated dopant concentration of the mesas 1b is substantially equal for all horizontal planes crossing the heterojunctions 18. Accordingly, the mesas 1b are depleted in the horizontal planes at the same reverse voltage.

Figure 5:
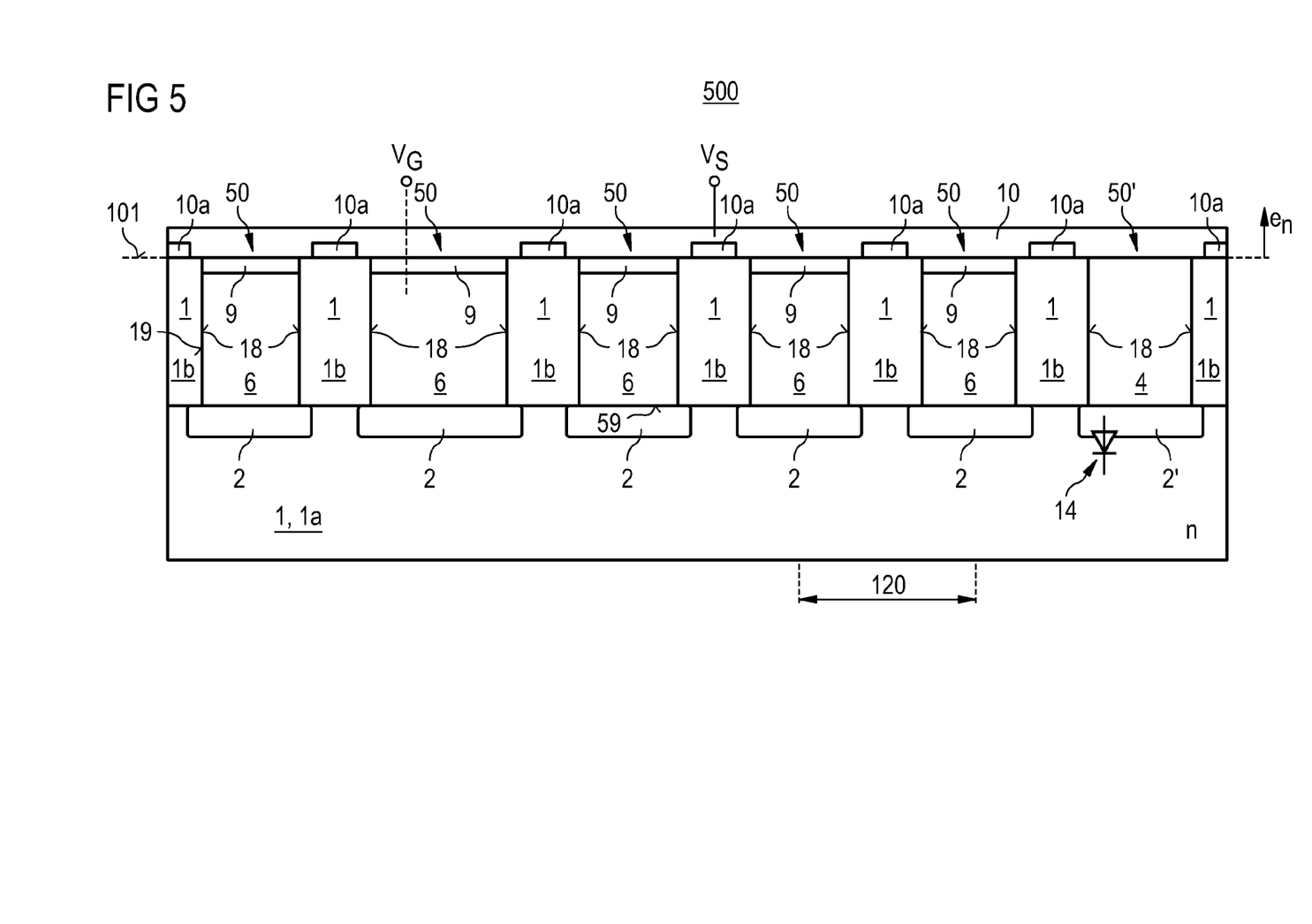
FIG. 5 illustrates a cross-section through a semiconductor body of a field-effect semiconductor device according to an embodiment.

FIG. 5 illustrates a vertical cross-section through a semiconductor device 500. The semiconductor device 500 is similar to the semiconductor devices 100, 200 illustrated above with regard to FIGS. 1, 2, respectively, and may also be operated as a three-terminal transistor. For sake of clarity, the drain layer (3) and the drain electrode (12) are not shown in FIG. 5. However, the rectifying junctions 18 of the semiconductor device 500 are formed as heterojunctions. Similar as explained above with regard to FIG. 2, one of more trenches 50' may be used to contact a respective second semiconductor region 2', which forms a body diode 14 with the drift layer 1a, with the front side metallization 10 to improve device behavior during an avalanche mode. Furthermore, a current spread layer (5) may additionally be formed below the drift layer 1a as explained above with regard to FIG. 3.

Using heterojunctions as rectifying junctions 18 also allows for a device in which mainly only electrons contribute to the current during normal operation. For this purpose, the semiconductor material of the mesas 1b (and the drift layer 1a) typically has a band-gap which is at least about 1 eV larger than the band-gap of the semiconductor material of the p-type gate layers or gate regions 6 which are arranged in the trenches 50. For example, the mesas 1b and the drift layer 1a may be made of SiC, for example 4H—SiC, and the gate regions 6 may be made of silicon or germanium, typically of poly-Silicon (poly-Si) to facilitate manufacturing. For the same reason, the p-type contact region 4 in trench 50' is also typically made of silicon or germanium, more typically of poly-Si.

For 4H—SiC/Si heterojunction diodes having a p$^+$-zone of Si (low-band gap material) forming a heterojunction with an n$^-$-zone of 4H—SiC, the following properties are known. The breakdown voltage is for same doping concentrations about the same compared to a homojunction pn-SiC diode. The leakage current is comparable to a Schottky diode. For example, the leakage current of those heterojunction diodes may be about $2 \times 10^{-5}$ A/cm$^2$ at a reverse biasing of about 1000 V for a diode of 1600 V rated blocking voltage. During forward biasing, no holes are injected into the n$^-$-zone. Similar as for Schottky diodes, the electron current is provided by the p$^+$-zone. Furthermore, the density of the electrons of the p$^+$-zone at the heterojunction (pn-junction) is tunable by the voltage drop across the heterojunction. Similar as for bipolar diodes, the electrons of the p$^+$-zone at the pn-junction is during reverse biasing with 100 V about $10^7$ cm$^{-3}$ and in forward bias of 1.2 V about $10^{16}$ cm$^{-3}$ (at given doping concentrations of $10^{20}$ cm$^{-3}$ for the p$^+$-zone (6) and $10^{16}$ cm$^{-3}$ for the n$^-$-zone (1b)). A similar device behavior is to be expected for other wide band-gap/small band-gap heterojunction diodes such as GaN/Si heterojunction diodes or SiC/Ge heterojunction diodes.

Accordingly, similar device properties are to be expected for the semiconductor device 500 and the semiconductor devices explained above with regard to FIGS. 1 to 4.

The semiconductor devices 100 to 500 explained above with regard to FIGS. 1 to 5 have in common that they include a semiconductor body 40 which extends to a main surface 101 and includes in a vertical cross-section: a drift layer 1a of a first conductivity type; one or more semiconductor mesa 1b of the first conductivity type each of which adjoins the drift layer 1a, substantially extends to the main surface 101 and has two side walls 19 at which a rectifying junction 18 is formed; and two or more second semiconductor regions 2 forming respective pn-junctions at least with the drift layer 1a so that each side wall 19 is arranged next to, typically adjoins, one the second semiconductor regions 2.

The rectifying junctions 18 may be a Schottky-junction as explained above with regard to FIGS. 1 to 4 or pn-heterojunction as explained above with regard to FIG. 5.

To avoid high electric fields close to the edges between the trench bottom walls 59 and the adjoining side walls 19, the edges may be rounded.

According to embodiments, similar semiconductor devices as explained above with regard to FIGS. 3 to 5 including the current spread layer 5 to improve on-resistance, but without the second semiconductor regions being provided. The semiconductor body 40 of these semiconductor devices also extends to a main surface 101 and includes in a vertical cross-section: a drift layer 1a of a first conductivity type; one or more semiconductor mesa 1b of the first conductivity type each of which adjoins the drift layer 1a, substantially extends to the main surface 101 and has two side walls 19 at which a respective rectifying junction 18 is formed; and a current spread layer 5 of the first conductivity type which is embedded in the semiconductor body 40, in ohmic contact with the drift layer 1a, arranged below the one or more semiconductor mesa 1b and has a maximum doping concentration higher than the drift layer 1a.

The semiconductor devices explained herein have in common that their semiconductor body 40 extends to a main surface 101 and includes, in a vertical cross-section substantially orthogonal to the main surface 101: a first semiconductor region 1 of a first conductivity type and made a first semiconductor material and at least two trenches 50, 51 extending from the main surface 101 partly into the first semiconductor region 1. Accordingly, the first semiconductor region 1 includes a drift layer 1a and one or more adjoining semiconductor mesas 1b each of which is arranged between a pair of adjacent trenches 50, 51 of the at least two trenches 50, 51. Each of the at least two trenches 50, 51 has, in the vertical cross-section, at least one side wall 19, typically two side walls 19 that may be tapered, and a bottom wall 59. On a lower portion of the at least one side wall 19 of each of the at least two trenches 50, 51 a rectifying junction 18 is formed, typically either by a Schottky-layer 8 forming a Schottky contact with the first semiconductor region 1 and one of the semiconductor mesas 1b, respectively, or by a semiconductor layer 6 of a second semiconductor material forming a hetero-junction with the first semiconductor region 1, and one of the semiconductor mesa 1b, respectively. In the vertical cross-section, the semiconductor body 40 further includes an embedded current spread layer 5 of the first conductivity type arranged below the at least two trenches 50, 51 and/or at least two second semiconductor regions 2 of a second conductivity type. The embedded current spread layer 5 is in ohmic contact with the first semiconductor region 1, and has a maximum doping concentration higher than a maximum doping concentration of the first semiconductor region 1. Each of the at least two second semiconductor regions 2 forms a pn-junction with the first semiconductor region 1, typically at least with the drift layer 1a, and adjoins the bottom wall 59 of one of the at least two trenches 50, 51.

The rectifying junction 18 is typically formed on both of the side walls 19 of one or more of the at least two trenches 50, 51, more typically on both of the side walls 19 of a plurality of the at least two trenches 50, 51.

In one or more of at least two trenches 50', the rectifying junction 18 may only be formed at one of the side walls 19, while at the other side wall 19 a highly conductive contact region 4 is formed that may, for example as a metal region, not form a rectifying junction 18 with the first semiconductor region 1 and the semiconductor mesa 1b, respectively.

In other embodiments, the highly conductive contact region 4 also forms a rectifying junction 18 with the semiconductor region 1 and the semiconductor mesa 1b, respectively. For example the first semiconductor region 1 may be made of monocrystalline n-type SiC, the at least two second semiconductor regions 2 may be made of monocrystalline p-type SiC, and the contact region 4 may be made of highly doped polycrystalline p-type Si for contacting one of the at least two second semiconductor regions 2.

Figure 6:
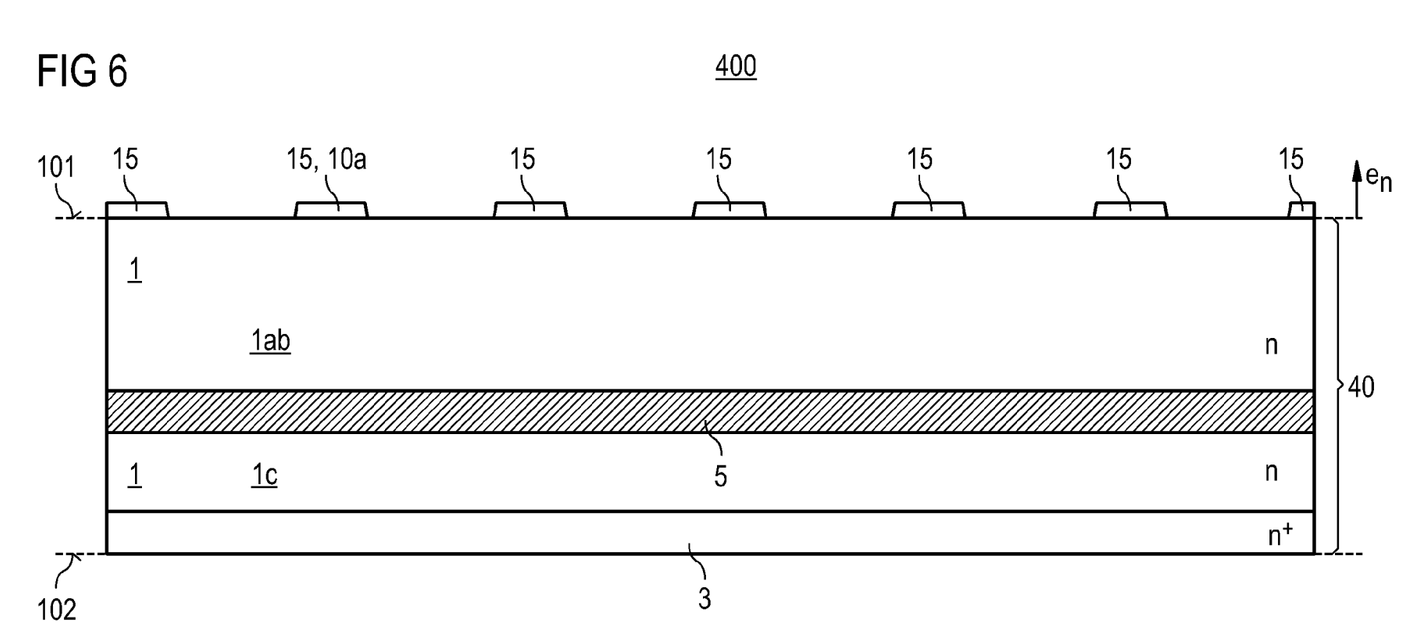
FIGS. 6 to 8 illustrates vertical cross-sections through a semiconductor body during method steps of a method according to embodiments.
Figure 7:
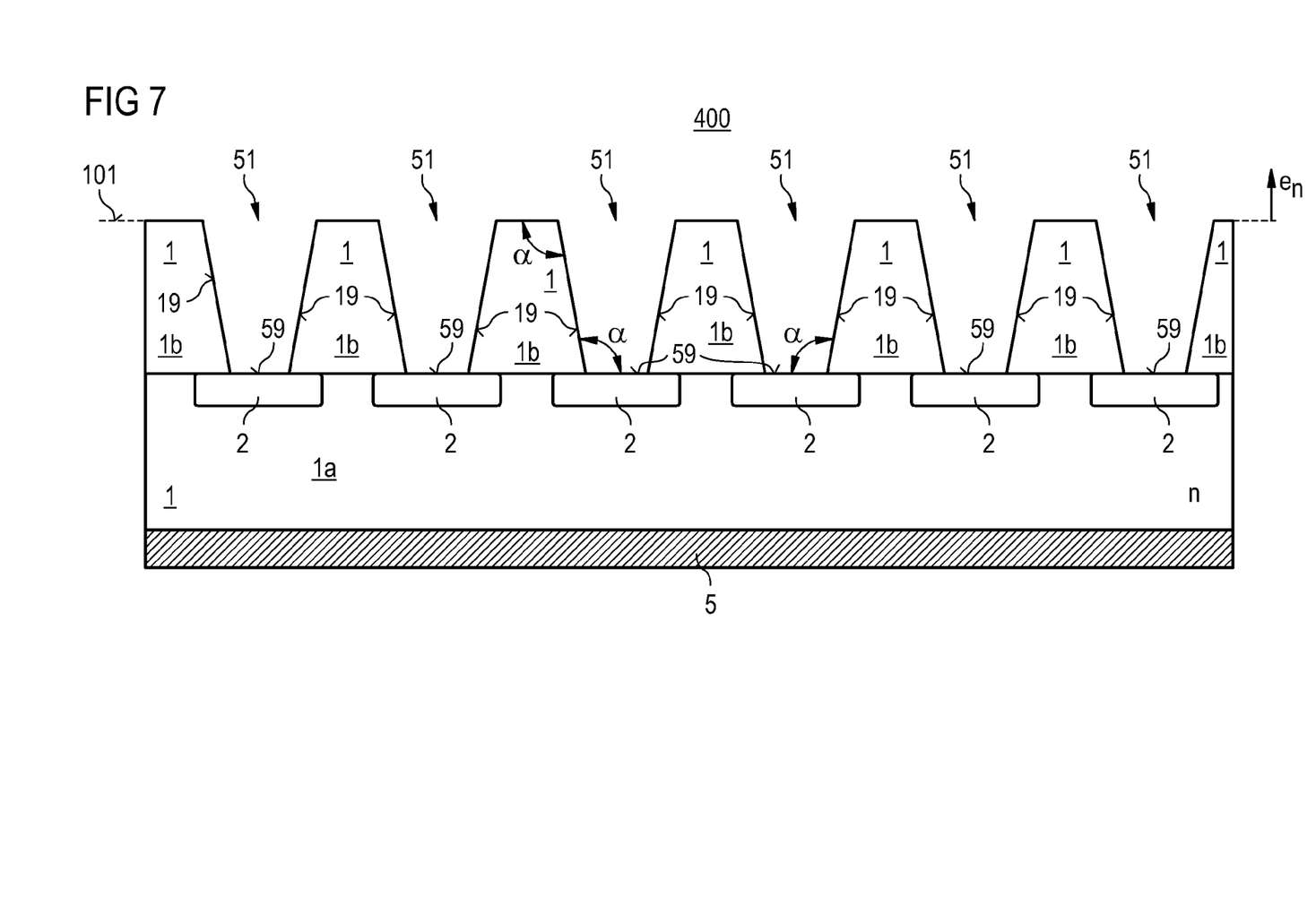
Figure 8:
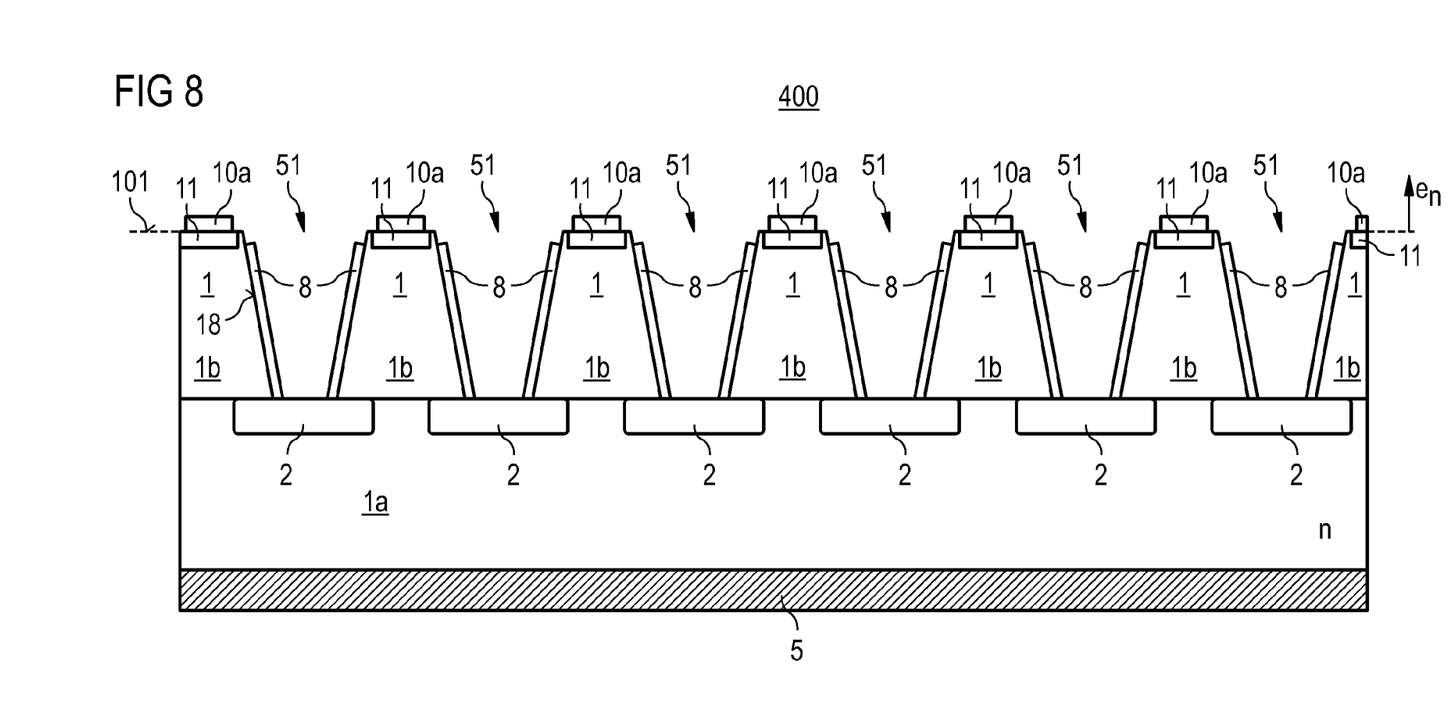

With regard to FIGS. 6 to 8, method steps of a method for forming a semiconductor device are illustrated in respective vertical cross-sections through a semiconductor body or semiconductor wafer 40.

In a first step, a wafer 40, for example a SiC-wafer, extending between a main surface 101 and a back surface 102 arranged opposite to the main surface 101 is provided. The wafer 40 may include a conductive substrate 3 extending to the back surface 102 and one or more epitaxial layers of the first conductivity type forming a first semiconductor layer 1 on the conductive substrate 3 and extending to the main surface 101.

Further, an embedded current spread layer 5 may be formed in the first semiconductor layer 1. The current spread layer 5 may be formed by a masked implantation of dopants of the first conductivity type into the first semiconductor layer 1 or by the deposition of an additional higher doped layer, e.g. by epitaxy.

Thereafter, a hard mask 15 may be formed on the main surface 101. The resulting semiconductor structure 400 is illustrated in FIG. 6. Forming the hard mask 15 typically includes forming a hard mask layer on the main surface 101, forming a resist mask on the hard mask layer, at least one light exposure of the hard mask layer through the resist mask, removing the mask, and etching hard mask layer. By using more than one light exposure of the hard mask layer, smaller structures may be formed in the hard mask.

In the exemplary embodiment, the current spread layer 5 divides the first semiconductor layer 1 in an upper portion 1ab and a lower portion 1c. The upper portion 1ab may include an uppermost semiconductor layer extending to the main surface 101 and a lower semiconductor layer extending between the uppermost semiconductor layer and the current spread layer 5. The uppermost semiconductor layer and the lower semiconductor layer may have substantially the same or different maximum doping concentrations which may be adjusted in accordance with device characteristics. Portions of the uppermost semiconductor layer typically form mesas and channel regions, respectively, in the semiconductor device to be manufactured.

The hard mask 15 is subsequently used for etching trenches and may have tapered side walls (flanks) for adjusting an angle between the main surface 101 and side walls of the trenches. The hard mask 15 may be an oxide mask or a metal mask made for example of a nickel or a nickel alloy. In the case of the hard mask 15 being a metal mask, the mask 15 may in the semiconductor device to be manufactured form source contacts as indicated by the reference numeral 10a of the second portion from the left of the hard mask 15. Accordingly, manufacturing may be facilitated.

Thereafter, trenches 51 may be etched using the hard mask 15. Typically, a dry chemical etching process is used to form a plurality of trenches 51 with respective side walls 19 and bottom walls 59. In so doing, a plurality of semiconductor mesas 1b are formed each of which is arranged between neighbouring trenches 51.

A high temperature annealing in a hydrogen atmosphere may be used, to round edges between the side walls 19 and the bottom walls 59. Accordingly, high electric fields during the blocking mode of the semiconductor device to be manufactured may be avoided. For example, the wafer may be annealed for about 0.4 hours to about 2 hours in a temperature range from about 1600° C. to about 1800° C.

Thereafter, second semiconductor regions 2 of a second conductivity type may be formed in the first semiconductor layer 1 so that the bottom wall 59 of each of the trenches 51 adjoins one of the second semiconductor regions 2. This typically includes implanting dopants of the second conductivity type through the bottom walls 59 and subsequent tempering.

Because of the presence of the second semiconductor regions 2, the electric field strength formed during the blocking mode close to the rectifying junctions to be formed at the side walls 19 and next to the bottom walls 19 may be reduced. Thus, the leakage current may be reduced. The resulting semiconductor structure 400 is shown in FIG. 7. For sake of clarity, the semiconductor regions below the current spread layer 5 are not shown in FIG. 7. The current spread layer 5 and forming the current spread layer 5, respectively, is optional in embodiments which include forming the second semiconductor regions 2.

In the exemplary embodiment illustrated in FIG. 7, the mesas 1b are formed as symmetric trapezoids having tapered side walls 19. Typically, an angle α between the side walls 19 and the main surface 101 and the bottom walls 59, respectively, is larger than about 92°. Accordingly, later forming of rectifying junctions at the side walls 19 is facilitated.

Thereafter, higher doped source contact regions 11 of the first conductivity type may be formed in the mesas 1b and at the main surface 101, for example by implantation, and source contacts 10a may be formed on the mesas 1b. In other embodiments, the source contact regions 11 are formed prior to forming the hard mask 15 used for etching the trenches 51, and/or the hard mask 15 is used as the source contacts.

Thereafter, rectifying junctions 18 may be formed at the side walls 19 of the trenches 51. The resulting semiconductor structure 400 is shown in FIG. 8. This may include forming a Schottky-contact forming layer 8 on the side walls 19 or forming hetero-junctions and a hetero-junction forming layer, respectively, on the side walls 19. The rectifying junction 18 may, in one or more of the trenches 51, only be formed at one of the two side walls 19, while at the other side wall 19 a highly conductive contact region (not shown in FIG. 8) is formed that may, for example as a metal region, not form a rectifying junction 18 at the respective side wall 19.

Forming heterojunctions may be achieved by depositing a semiconductor material of a second conductivity type having a lower band-gap than the mesas 1b, typically lower by at least 1 eV, such as silicon or germanium and subsequent back-etching. The heterojunctions are typically formed between the mesas 1b and a deposited non-mono-crystalline semiconductor material, for example doped poly-Si, using an appropriate PVD (physical vapor deposition) process. Accordingly, mechanical stress resulting from the hetero-junction between the mesas 1b and the gate regions formed in the trenches 51 is at least substantially reduced. After depositing, the trenches 51 are typically filled without voids. After back etching, respective uppermost portions of the trenches 51 may be filled with a dielectric region arranged on the respective gate regions. Completely filling the trenches 51 facilitates later forming of a front side metallization, gate contacts and a gate metallization on the main surface 101.

Finally, a drain metallization may be formed opposite to the front side metallization and at the conductive substrate 3 forming a drain region. The resulting semiconductor device is similar as explained above with regard to FIG. 5, but has tapered side walls 19. To form an integrated body diode as illustrated in FIG. 5, one or more of the trenches 51 can be masked prior to back-etching and the dielectric regions deposited.

In the exemplary embodiment illustrated in FIG. 8, Schottky-contact forming layers 8 are formed at the side walls 19. This typically includes a PVD process for depositing a layer of a Schottky-metal (Schottky-metal layer) such as titanium. The Schottky-metal layer is typically removed at and next to the main surface 101. This may be achieved by an oxide-lift-off process or masked etching.

Thereafter, a conductive layer of highly doped poly-Si or a metal having a higher electric conductivity than the Schottky-contact forming layer 8 may be formed on the Schottky-contact forming layer 8.

Thereafter, the remaining portions of the trenches 51 may be substantially void-free filled with respective dielectric regions 9 which are arranged between the main surface 101 and the Schottky-contact forming layers 8.

Thereafter, a front side metallization 10 in ohmic contact with the first semiconductor layer 1 may be formed on the main surface 101.

Thereafter, a drain metallization 12 may be formed opposite to the front side metallization 10 and in ohmic contact with the first semiconductor layer 1. The resulting semiconductor device 400 is illustrated in FIG. 4.

For integrating a body diode 14 and a contact region 4 for providing an ohmic contact with the front side metallization 10 as illustrate above with regard to FIG. 2, a highly conductive layer of, for example, highly doped poly-Si of the second conductivity type or a metal may be formed at one or more side walls 19 instead of the Schottky-contact forming layers 8. Alternatively, forming the contact regions 4 includes implanting dopants of the second conductivity type through respective side walls 19.

The methods explained above with regard to FIGS. 6 to 8 allow for reliable adjusting device parameters such as on-state resistance, leakage current, switching losses and/or parasitic device capacitances such as the Miller capacitance. Furthermore, forming of the front side metallization 10 is facilitated as a substantially flat surface may be provided prior to depositing the front side metallization 10.

According to an embodiment of a method for producing a field-effect semiconductor device, the method includes: providing a wafer having a main surface and a first semiconductor layer of a first conductivity type; forming at least two trenches from the main surface partly into the first semiconductor layer so that each of the at least two trenches includes, in a vertical cross-section substantially orthogonal to the main surface, a side wall and a bottom wall, and that a semiconductor mesa is formed between the side walls; forming at least two second semiconductor regions of a second conductivity type in the first semiconductor layer so that the bottom wall of each of the at least two trenches adjoins one of the at least two second semiconductor regions; and forming a rectifying junction at the side wall of at least one of the at least two trenches.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those cases in which this has not explicitly been mentioned. Such modifications to the inventive concept are intended to be covered by the appended claims.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method for forming a field-effect semiconductor device, the method comprising:
   providing a wafer comprising a main surface and a first semiconductor layer of a first conductivity type;
   forming at least two trenches from the main surface partly into the first semiconductor layer so that each of the at least two trenches comprises, in a vertical cross-section substantially orthogonal to the main surface, a side wall and a bottom wall, and that a semiconductor mesa is formed between the side walls of the at least two trenches;
   forming at least two second semiconductor regions of a second conductivity type in the first semiconductor layer so that the bottom wall of each of the at least two trenches adjoins one of the at least two second semiconductor regions; and
   forming a rectifying junction at the side wall of at least one of the at least two trenches,
   wherein the first semiconductor layer comprises a first semiconductor material,
   wherein forming the rectifying junction comprises at least one of:
      forming a Schottky-contact forming layer on the side wall; and
      forming a hetero junction on the side wall.

2. The method of claim 1, wherein providing the wafer comprises at least one of:
   providing a silicon carbide wafer;
   providing the wafer as a wafer which further includes an embedded current spread layer of the first conductivity type having a maximum doping concentration higher than a maximum doping concentration of the first semiconductor layer;
   providing a substrate of the first conductivity type;
   forming on the substrate an epitaxial layer of the first conductivity type;
   forming a mask on the epitaxial layer;
   implanting dopants of the first conductivity type into a layer of the epitaxial layer;
   removing the mask; and
   forming on the epitaxial layer a further epitaxial layer of the first conductivity type.

3. The method of claim 1, wherein forming the at least two trenches comprises:
   forming a hard mask comprising forming a hard mask layer on the main surface, forming a resist mask on the hard mask layer and at least one light exposure of the hard mask layer through the resist mask.

4. The method of claim 1, wherein forming the at least two trenches comprises: forming a metal mask.

5. The method of claim 1, wherein forming the at least two trenches comprises:
   masked etching so that an angle between the bottom wall and the side wall of at least one of the at least two trenches is larger than about 92°.

6. The method of claim 1, wherein forming the at least two trenches comprises: thermal annealing.

7. The method of claim 1, wherein the Schottky-contact forming layer and/or the hetero junction are formed on the side wall by at least one of:
   a PVD process;
   depositing titanium;
   depositing poly-silicon;
   filling the at least two trenches with a second semiconductor material forming a heterojunction with the semiconductor mesa;
   partly back-etching of the second semiconductor material; and
   removing the Schottky-contact forming layer next to the main surface.

8. The method of claim 7, further comprising forming a conductive layer on the Schottky-contact forming layer, the conductive layer having a higher electric conductivity than the Schottky-contact forming layer.

9. The method of claim 1, wherein forming the at least two second semiconductor regions comprises implanting dopants of the second conductivity type through the bottom walls of the at least two trenches.

10. The method of claim 1, further comprising:
    forming a dielectric region in at least in an upper portion of at least one of the at least two trenches.

11. The method of claim 1, further comprising:
    forming a front side metallization on the main surface in ohmic contact with the first semiconductor layer.

12. The method of claim 1, further comprising:
    forming a contact region of the second conductivity type, the contact region providing an ohmic contact between the front side metallization and one of the at least two second semiconductor regions.

13. The method of claim 1, further comprising:
    forming a drain metallization opposite to the front side metallization and in ohmic contact with the first semiconductor layer.

14. A method for forming a field-effect semiconductor device, the method comprising:
    providing a wafer comprising a main surface, a first semiconductor layer of a first conductivity type extending to the main surface, and an embedded current spread layer of the first conductivity type having a maximum doping concentration higher than a maximum doping concentration of the first semiconductor layer;
    forming at least two trenches from the main surface partly into the first semiconductor layer so that each of the at least two trenches comprises, in a vertical cross-section substantially orthogonal to the main surface, a side wall and a bottom wall arranged above the current spread layer, and that a semiconductor mesa is formed between the side walls of the at least two trenches; and
    forming a rectifying junction at the side wall of each of the at least two trenches,
    wherein forming the rectifying junction comprises at least one of:
       forming a Schottky-contact forming layer on the side wall of each of the at least two trenches; and
       forming a hetero junction on the side wall of each of the at least two trenches.

15. The method of claim 14, further comprising:
    forming at least two second semiconductor regions of a second conductivity type in the first semiconductor layer and above the current spread layer so that the bottom wall of each of the at least two trenches adjoins one of the at least two second semiconductor regions.

16. A method for forming a field-effect semiconductor device, the method comprising:
    providing a semiconductor body having a main surface; and
    forming in a vertical cross-section substantially orthogonal to the main surface:
    a drift layer of a first conductivity type;
    a semiconductor mesa of the first conductivity type adjoining the drift layer, substantially extending to the main surface and comprising a first side wall, with a rectifying junction being formed at the first side wall; and
    two second semiconductor regions of a second conductivity type arranged next to the semiconductor mesa, each of the two second semiconductor regions forming a pn-junction at least with the drift layer,
    wherein an angle between the main surface and the first side wall is larger than about 92°.

* * * * *

UNITED STATES PATENT AND TRADEMARK OFFICE
CERTIFICATE OF CORRECTION

PATENT NO. : 9,608,092 B2  
APPLICATION NO. : 14/822267  
DATED : March 28, 2017  
INVENTOR(S) : J. Konrath et al.

Page 1 of 1

It is certified that error appears in the above-identified patent and that said Letters Patent is hereby corrected as shown below:

Column 15, Line 37 (Claim 1, Line 25), please change "hetero junction" to -- heterojunction --
Column 16, Line 4 (Claim 7, Line 2), please change "hetero junction" to -- heterojunction --
Column 16, Line 62 (Claim 14, Line 23), please change "hetero junction" to -- heterojunction --

Signed and Sealed this
Twentieth Day of June, 2017

Joseph Matal
*Performing the Functions and Duties of the*
*Under Secretary of Commerce for Intellectual Property and*
*Director of the United States Patent and Trademark Office*